(12) United States Patent
Hannebauer

(10) Patent No.: US 8,232,127 B2
(45) Date of Patent: Jul. 31, 2012

(54) THERMO-ELECTRIC SEMICONDUCTOR DEVICE AND METHOD FOR MANUFACTURING THE SAME

(75) Inventor: Robert Hannebauer, Vancouver (CA)

(73) Assignees: Hanvision Co., Ltd. (KR); Lumiense Photonics Inc. (CA)

( * ) Notice: Subject to any disclaimer, the term of this patent is extended or adjusted under 35 U.S.C. 154(b) by 78 days.

(21) Appl. No.: 12/946,049

(22) Filed: Nov. 15, 2010

(65) Prior Publication Data
US 2011/0065223 A1  Mar. 17, 2011

Related U.S. Application Data

(62) Division of application No. 12/237,041, filed on Sep. 24, 2008.

(51) Int. Cl.
*H01L 35/34* (2006.01)
(52) U.S. Cl. .................. 438/55; 257/E23.082; 257/930; 136/201
(58) Field of Classification Search .................. None
See application file for complete search history.

(56) References Cited

U.S. PATENT DOCUMENTS

| | | | | | |
|---|---|---|---|---|---|
| 5,837,929 | A | * | 11/1998 | Adelman | 136/225 |
| 5,994,638 | A | * | 11/1999 | Edelson | 136/205 |
| 7,544,883 | B2 | * | 6/2009 | Chen et al. | 136/224 |
| 7,586,125 | B2 | * | 9/2009 | Dai et al. | 257/81 |
| 7,649,139 | B2 | * | 1/2010 | Mihara et al. | 136/236.1 |
| 2005/0139249 | A1 | * | 6/2005 | Ueki et al. | 136/211 |

FOREIGN PATENT DOCUMENTS

| | | |
|---|---|---|
| JP | 2007-027448 | 2/2007 |
| KR | 1998-082255 | 12/1998 |
| KR | 10-2001-0105763 | 11/2001 |
| KR | 10-0663117 | 12/2006 |

OTHER PUBLICATIONS

Taofang Zeng, Thermionic-tunneling Multilayer Nanostructures for Power Generation, Applied Physics Letters, Apr. 10, 2006, p. 153104-1-153104-3, vol. 88, American Institute of Physics.

* cited by examiner

*Primary Examiner* — Benjamin Sandvik
(74) *Attorney, Agent, or Firm* — Cantor Colburn LLP

(57) ABSTRACT

A thermo-electric semiconductor device is provided. The thermo-electric semiconductor device includes: a first electrode layer; a spacer layer formed on the first electrode layer and having a plurality of pillars with a uniform height, the plurality of pillars thermally grown and protruded on a surface of the spacer layer; and a second electrode layer formed over the spacer layer in such a manner as to contact tops of the protruded pillars.

5 Claims, 5 Drawing Sheets

(a)

(b)

(c)

(d)

(e)

(f)

(g)

(h)

(a)

(b)

(c)

(d)

(e)

(f)

(g)

(h)

(i)

THERMO-ELECTRIC SEMICONDUCTOR DEVICE AND METHOD FOR MANUFACTURING THE SAME

This application is a divisional application of U.S. patent application Ser. No. 12/237,041, filed Sep. 24, 2008, the entire contents of which are incorporated hereinto by reference.

BACKGROUND OF THE INVENTION

1. Field of the Invention

The present invention relates to a semiconductor device, and more particularly, to a thermo-electric semiconductor device.

2. Description of the Related Art

Thermionic emission is a well known effect in which phonons add enough energy to charge carriers in a solid to allow the charge carriers to be ejected from the surface of the material. The charge carriers transport energy away from the bulk of the material in the form of an electrical current. The use of thermal energy to provide electrical current underlies the fundamental thermal to electrical conversion.

Quantum Mechanical tunneling (also known as direct tunneling) is also a well known effect. In direct tunneling, charge carriers can overcome a barrier by so called tunneling through the barrier. In a classical sense, a particle enclosed with a barrier cannot ever overcome the barrier, but in quantum mechanical systems, if the barrier is made thin enough, there is a certain probability that the charge carriers can overcome the barrier. This process is called tunneling in the literature. Tunneling starts to take effect if two surfaces are spaced apart by at most 10 nm and becomes very pronounced at distance scales of 1 nm.

Direct tunneling assisted thermionic devices use the tunneling effect to reduce the apparent work-function of the surface to allow thermionic emission to take place at greatly reduced temperatures. The work-function is a barrier to the electrons ejected from the surface of the material, with the tunneling reducing the effective barrier height. The electrons will be ejected from the surface of the material through the momentum distribution that they have within the material, this momentum distribution is due to the temperature of the material.

Tunneling assisted thermionic devices have been envisioned for some time. This work addresses techniques that allow these devices to be manufactured and operated at low cost. In order to realize the direct tunneling assistance of the thermionic effect, the device must comprise two parallel plates, which are held very close together (on the order of 1 nm) while maintaining very low thermal conductivity between the two plates. A thermal gradient is placed across the two plates, the heated plate will eject charge carriers which are collected by the low temperature plate and causes current to flow. The requirement for low thermal conductivity allows for a high thermal gradient to be placed across the gap between the plates.

Most common devices that have demonstrated tunneling assisted thermionic emission have used vacuum as the medium between the two plates as it has the most optimal thermal conductivity properties. The problem in the design of such a device is to ensure that the spacing between the plates is accurate and does not change with temperature.

To accurately control the spacing between the plates, an obvious solution is to provide a solid material that acts as an accurate spacer between the two plates. An ideal material will have very low thermal conductivity. However, even the materials that have the lowest thermal conductivity cannot be used, this is because the gap required (1 nm) is so small that the thermal resistance between the plates is too low to support an appropriate thermal difference. A calculation here is illuminating:

Material: $SiO_2$, $G_{th}$=1 W/m·K, Thickness of material 1 nm, area of device perpendicular to heat flow 10 mm×10 mm=1×$10^{-4}$ $m^2$.

$1 \times (1 \times 10^{-4})/(1 \times 10^{-9}) = 1 \times 10^5$ (W/K), in other words, this device could support up to 100 KW of heat and only have 1K (or 1 C) temperature drop across it. It is a very good thermal conductor even though the material itself has a very low thermal conductance.

Another well-known technique is disclosed on a thesis entitled "Thermionic-tunneling multilayer nanostructures for power generation", published on 10 Apr. 2006, by Taofang Zeng. This thesis discloses a structure where dielectric nano-wires or nano-particles are sandwiched between two electrodes. However, in this technique, there is a problem that dielectric nano-wires or nano-particles are fixed unstably on the surfaces of the electrodes, and the dielectric nano-wires or nano-particles are arranged irregularly.

SUMMARY OF THE INVENTION

In accordance with one embodiment of the present invention, a thermo-electric semiconductor device is disclosed in which a plurality of thermally grown pillars are sandwiched between two electrode layers. Since the pillars are thermally grown from the electrode layers, the pillars are fixed stably and arranged uniformly on the electrode layers.

In accordance with another embodiment of the present invention, a thermo-electric semiconductor device is disclosed in which a plurality of pillars are protruded from the bottoms of pits formed on a first electrode. A second electrode layer is placed on the tops of the plurality of pillars and is spaced away from the first electrode. Since the pillars are formed within the pits, the length of each pillar can be longer than the spacing between the first and second electrode layers and accordingly the thermal conduction through the pillars is reduced. Therefore, the gap between the first and second electrode layers can be much less than the length of the pillars, which means higher possibility of direct tunneling. Accordingly, it is possible to form pillars that are larger in cross section without influencing performance. By forming the pillars with larger cross section, the two electrode layers above and below the pillars can more easily withstand vacuum force when the gap is in a vacuum state.

In accordance with another embodiment of the present invention, a method for fabricating a thermo-electric semiconductor device is disclosed in which a plurality of spacer regions penetrated into a first electrode layer are formed, the spacer regions are selectively etched to form a plurality of pillars, and then a second electrode layer is bonded to tops of the plurality of pillars.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EXEMPLARY EMBODIMENTS

Figure 1:
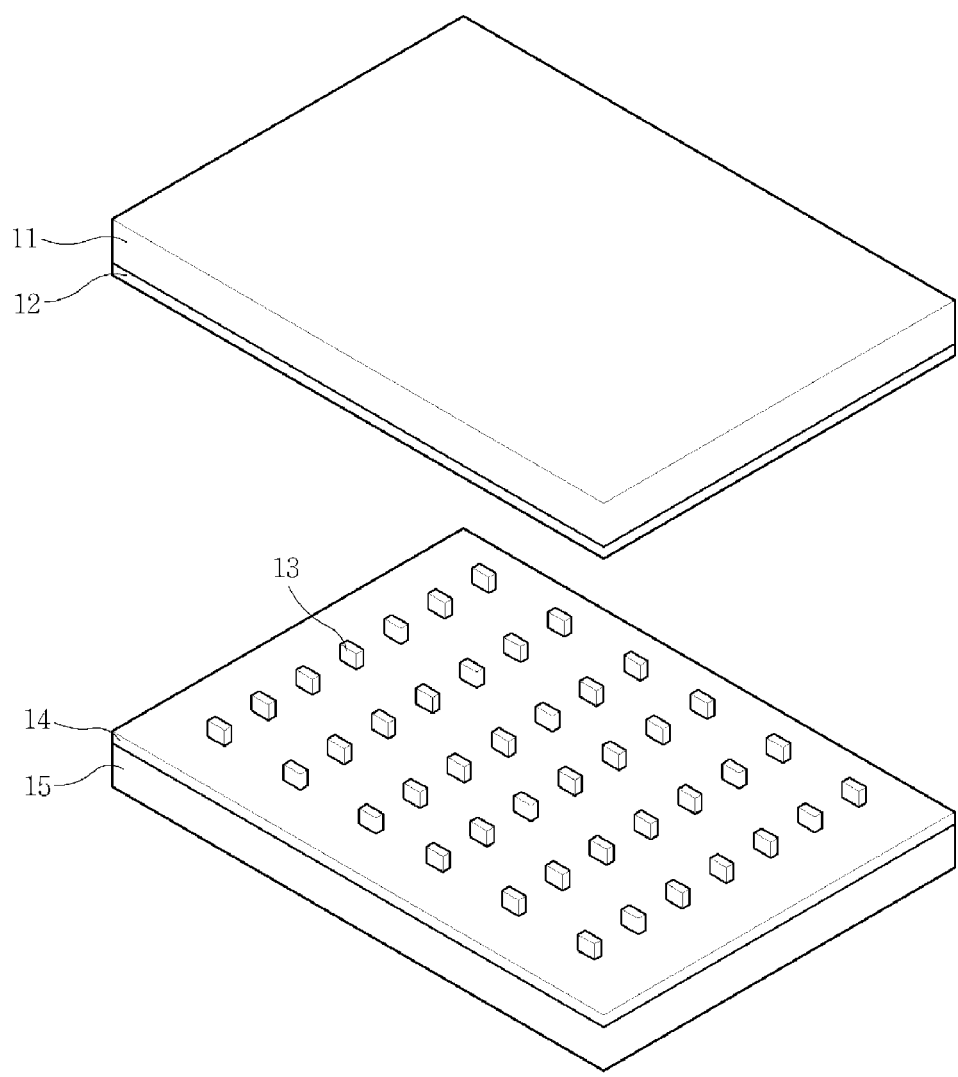
FIG. 1 is a perspective view for explaining a thermo-electric semiconductor device according to an embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements. The tunneling assisted thermionic diode is generically referenced in the text as a heat diode. References to a heat diode in the text are references to the tunneling assisted thermionic diode.

FIG. 1 is a perspective view for explaining a thermo-electric semiconductor device according to one embodiment of the present invention. Referring to FIG. 1, the thermo-electric semiconductor device includes a first electrode layer 15; a plurality of pillars 13 with a uniform height, each protruded from the first electrode layer 15; and a second electrode layer 11 which rests on top of the plurality of pillars 13. The pillars 13 are formed by a semiconductor manufacturing process, which will be explained in more detail later. The pillars 13 are thermally grown and protruded on a surface of the first electrode layer 15.

The first electrode layer 15 is made of n-type bulk silicon, and will serve as the cathode of the heat diode. The cathode is also a node that will be at a higher temperature. The second electrode layer 11 is made of p-type bulk silicon and will serve as an anode of the heat diode. The anode is also a node that will be at a lower temperature. However, it is well known to those skilled in the art that the first electrode layer 15 is formed with p-type bulk silicon using a semiconductor manufacturing process to thus manufacture a semiconductor device similar to that shown in the drawing.

According to an aspect of the present invention, the plurality of pillars 13 are thermally grown on the surface of the first electrode layer 15, thus firmly fixed to the first electrode layer 15 because they are integrated with the first electrode layer 15. Furthermore, locations at which such thermal growth is carried out can be controlled by a semiconductor manufacturing process, and accordingly the pillars 13 can be arranged at regular intervals. In FIG. 1, each pillar 13 has a shape of a square pillar, however, the pillars 13 can have various shapes.

According to an embodiment of the present invention, the pillars 13 are formed by selectively thermally oxidizing the first electrode layer 15 which is a doped silicon layer. The plurality of pillars 13 are integrated with the first electrode layer 15 as they also are formed from oxidation of the first electrode layer 15 and penetrate layer 15.

As illustrated in FIG. 1, a layer 14 is formed on one surface of the first electrode layer 15. The layer 14 can be a native silicon dioxide ($SiO_2$) layer formed by naturally oxidizing the second electrode layer 15, after the pillars 13 are formed. Conversely, the layer 14, can be formed before the pillars 13 are grown. In this case, the pillars 13 are integrated with the layer 14 which is thermally grown from the first electrode layer 15. Examples of these layers are multiple layers of dielectric material, silicon rich oxide or almost any other semiconductor compatible material.

As illustrated in FIG. 1, a layer 12 is formed on one surface of the second electrode layer 11. The layer 12 can be a native silicon dioxide ($SiO_2$) layer formed by naturally oxidizing the second electrode layer 11, like one version of the spacer layer 14 or it can also be multiple layers of dielectric material, silicon rich oxide or almost any other semiconductor compatible material.

Figure 2:
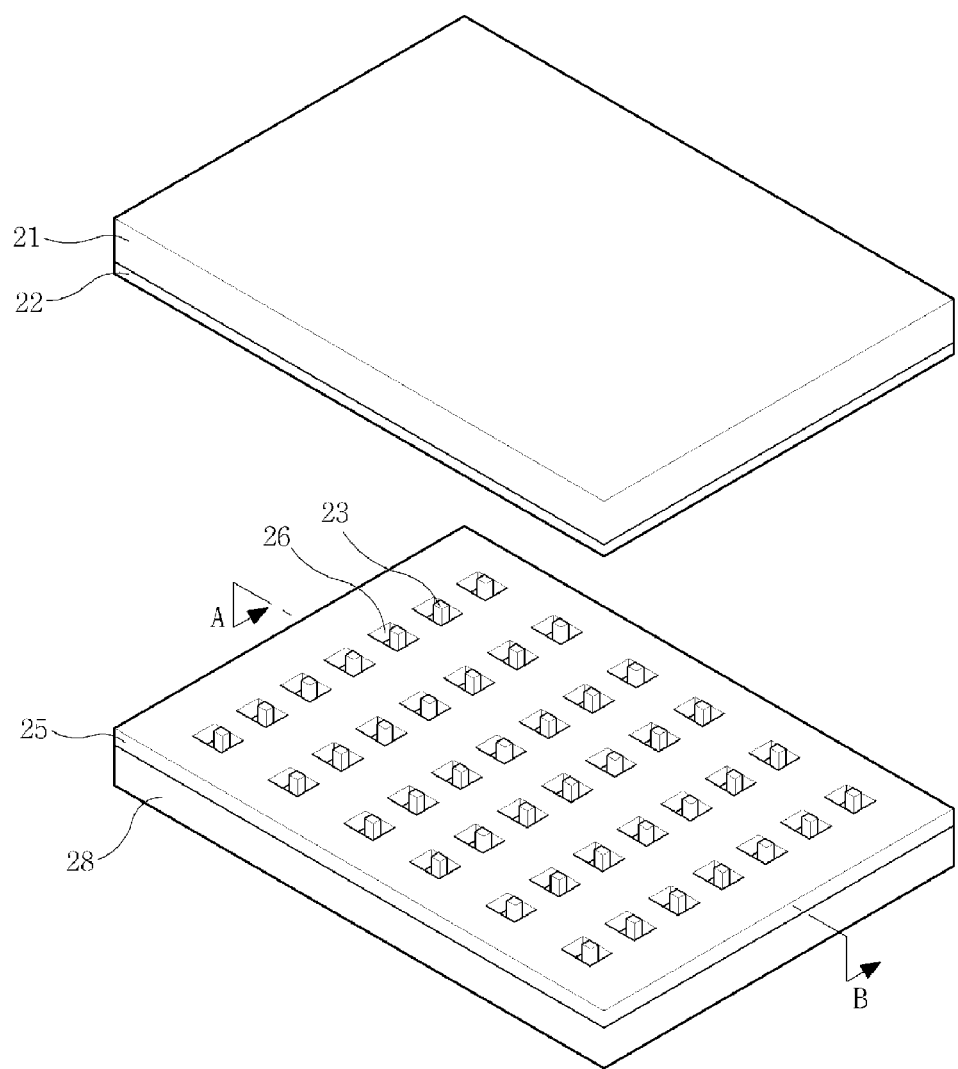
FIG. 2 is a perspective view for explaining a thermo-electric semiconductor device according to another embodiment of the present invention.

FIG. 2 is a perspective view for explaining a thermo-electric semiconductor device according to another embodiment of the present invention. Referring to FIG. 2, the thermo-electric semiconductor device includes a first electrode layer 28 having a plurality of pits 26 thereon; a plurality of pillars 23 each protruded from a bottom of each pit 26, the plurality of pillars 23 having a uniform height thereon; and a second electrode layer 21, whose surface is flat, contacting tops of the plurality of pillars 23. In FIG. 2, each pillar 23 has a shape of a square pillar, however, the pillars 23 can have various shapes.

In FIG. 2, the first electrode layer 28 is made of n-type bulk silicon, and will serve as a cathode of a heat diode. The cathode is also a node that will be at a higher temperature. The second electrode layer 21 is made of p-type bulk silicon, and will serve as an anode of the heat diode. The anode is also a node that will be at a lower temperature. However, it is well known to those skilled in the art that the first electrode layer 28 is formed with p-type bulk silicon using a semiconductor manufacturing process to thus manufacture a semiconductor device similar to that shown in the drawing.

As illustrated in FIG. 2, a layer 25 is formed on one surface of the first electrode layer 28 according to the further feature of the present invention. The layer 25 can be a native silicon dioxide ($SiO_2$) layer formed by naturally oxidizing the first electrode layer 28 after the pillars are formed. Conversely, the layer 25, can be formed before the pillars 23 are grown. Examples of these layers are multiple layers of dielectric material, silicon rich oxide or almost any other semiconductor compatible material.

As illustrated in FIG. 2, a layer 22 is formed on one surface of the second electrode layer 21. The layer 22 can be a native silicon dioxide ($SiO_2$) layer formed by naturally oxidizing the second electrode layer 21 or it can also be multiple layers of dielectric material, silicon rich oxide or almost any other semiconductor compatible material.

Figure 3:
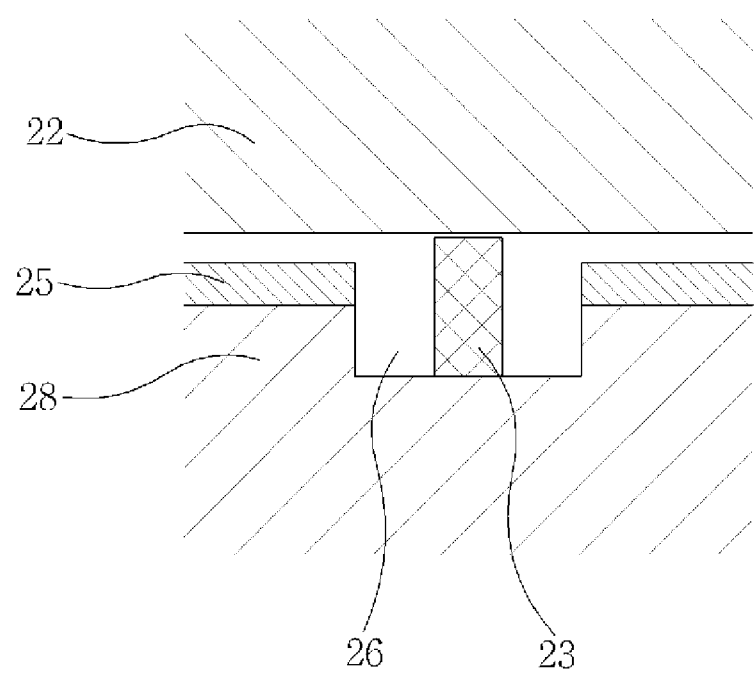
FIG. 3 is a part of a cross-sectional view cut along a line A-B of FIG. 2.

As shown in FIG. 3, which is a part of the cross-sectional view cut along a line A-B of FIG. 2, showing one of the pits, the layer 22 is spaced apart by a gap d from the upper surface of the first electrode layer 28 and layer 25. Comparing the embodiment illustrated in FIG. 2 with the embodiment illustrated in FIG. 1, the lengths of the pillars 23 are longer than those of the pillars 13 of the embodiment illustrated in FIG. 1 because the pillars 23 are formed within the pits 26. Accordingly, thermal conductivity through the pillars 23 is minimized and efficiency of thermoelectric device is enhanced. Furthermore, since the gap d between the two electrode layers 21 and 28 is very narrow, there is high possibility of direct tunneling. Accordingly, it is possible to form pillars with a larger cross-section without influencing thermal performance. By forming the pillars 23 with large cross-section, the two electrode layers 21 and 28 above and below the pillars 23 can more easily withstand vacuum force when the gap d is in a vacuum state.

Figure 4:
FIG. 4 is a view for explaining a method of fabricating the thermo-electric semiconductor device illustrated in FIG. 1, according to an embodiment of the present invention.
Figure 4:
Figure 4:
Figure 4:
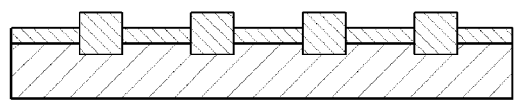
Figure 4:
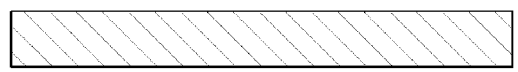
Figure 4:
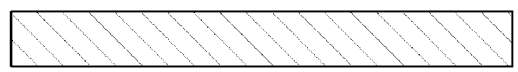
Figure 4:
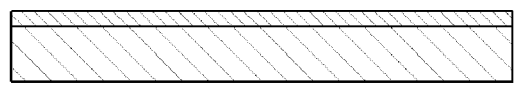
Figure 4:
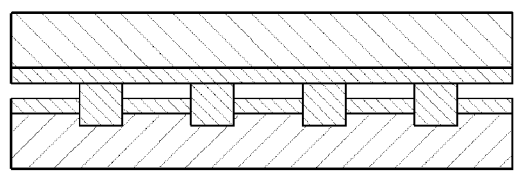

FIG. 4 is a view for explaining a method of fabricating the thermo-electric semiconductor device illustrated in FIG. 1, according to an embodiment of the present invention. Referring to FIG. 4, the thermo-electric semiconductor device fabricating method includes: preparing a first electrode layer; forming an oxide layer on the first electrode layer; forming a mask pattern on the oxide layer; thermally growing the oxide layer selectively using the mask pattern to form a plurality of pillars; and bonding a second electrode layer to tops of the plurality of pillars. Below is given a detailed explanation for the method according to the embodiment with reference to the FIG. 4.

First, an input wafer, that is, a N-type silicon wafer is prepared (step (a)). The silicon wafer will serve as a cathode of a heat diode, and is also a node that will be at a higher temperature. Then, the backside of the silicon wafer is stripped and ground, and the front side of the silicon wafer is stripped and wet etched to be in a hydrophobic state (step (b)).

Then, the surface of the silicon wafer is oxidized to form a native oxide layer (the dark-colored layer in step (c)) which will serve as a pad oxide layer for subsequent nitride deposition. Note at this point, this layer can be any of several semiconductor compatible materials such as a Silicon Rich Oxide (SRO) or Multi-Layer Dielectric (MLD) and are not restricted here as long as they also act as a pad layer to relieve stress between the wafer and the nitride hard mask. But for convenience we will continue to call this the oxide pad layer until these different functions are revealed.

The thickness of the pad oxide layer is about 6 Å and is a common thickness needed for the subsequent nitride thickness and is an industry standard step. Then, a silicon nitride layer is deposited on the native oxide layer which will be used as a hard mask. The thickness of the silicon nitride layer is about 180 nm, but not limited to, and is designed to be sufficient to withstand the next processing steps. Industry standard thicknesses are used here and is similar to a LOCOS process.

In step (d), the silicon nitride layer is patterned using standard lithographic and etching techniques and then partially removed. Next a wet etch is performed to remove the underlying layer, the recipe is adapted for the type of layer present, i.e. where it is the native pad oxide, the SRO or the MLD. This step is done with the photo-resist still on to protect the nitride hard mask. Next the photo-resist is stripped and, the wafer is put into a furnace and oxide is thermally grown in areas that are exposed through the silicon nitride layer, so that a plurality of oxide pillars are formed. Such thermal growth is carried out so that the oxide layer rises to slightly more higher than the buffer layer, ideally 1 nm above. During this process, some of the silicon is consumed so the pillar will actually be embedded into the wafer at this point. Then, the remaining nitride is stripped and the resultant structure is shown in step (d). Also, the lower portion of FIG. 1 shows a perspective view of the resultant structure.

Meanwhile, another input wafer, a P-type silicon wafer is prepared (step (e)). The silicon wafer will serve as an anode of the heat diode, and is also a node that will be at a lower temperature. Then, in step (f), the backside of the silicon wafer is stripped and ground, and the front side of the silicon wafer is stripped and wet etched to be in a hydrophobic state. At this time, a native oxide layer is formed on the surface of the silicon wafer that is to be bonded to the tops of the plurality of pillars. Note at this point, this layer can be any of several semiconductor compatible materials such as a Silicon Rich Oxide (SRO) or Multi-Layer Dielectric (MLD) and are not restricted here. But for convenience we will continue to call this the native oxide layer until these different functions are revealed.

Next, the P-type silicon wafer is flipped and placed face to face with the N-type silicon wafer described above, so that a structure illustrated in step (h) is finally obtained. At this step the wafers may be bonded according industry standard practices like plasma enhanced bonding. The P-type wafer is flipped such that the top surface of the wafer is presented to and mated with the top surface of the n-type wafer.

Since the plurality of oxide pillars are thermally grown from the native oxide layer obtained by oxidizing the silicon wafer, the oxide pillars can be strongly bonded to the silicon wafer and also can be arranged at regular intervals since the oxide pillars are grown from the areas patterned by the mask.

Figure 5:
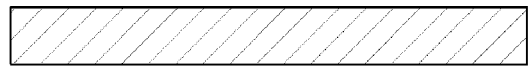
FIG. 5 is a view for explaining a method of fabricating the thermo-electric semiconductor device illustrated in FIG. 2, according to another embodiment of the present invention.
Figure 5:
Figure 5:
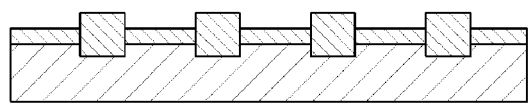
Figure 5:
Figure 5:
Figure 5:
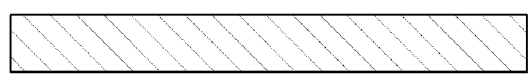
Figure 5:
Figure 5:
Figure 5:
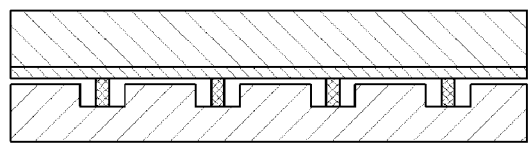

FIG. 5 is a view for explaining a method of fabricating the thermo-electric semiconductor device illustrated in FIG. 2, according to another embodiment of the present invention.

Referring to FIG. 5, the method for fabricating the thermo-electric semiconductor device includes: preparing a first electrode layer; forming a plurality of spacer regions penetrated into the first electrode layer; selectively etching a portion of the spacer regions and a portion of the first electrode layer around the portion of the spacer regions to form a plurality of pillars; and bonding a second electrode layer to tops of the plurality of pillars. Below is given a detailed explanation for the method according to the embodiment with reference to the FIG. 5.

First, an input wafer, that is, a N-type silicon wafer is prepared (step (a)). The silicon wafer will serve as a cathode of a heat diode, and is also a node that will be at a higher temperature. The backside of the silicon wafer is stripped and ground, and the front side of the silicon wafer is stripped and wet etched to be in a hydrophobic state.

Then, the surface of the silicon wafer is oxidized to form a native oxide layer (the dark-colored layer in step (b)), which will serve as a pad oxide layer for subsequent nitride deposition. Note at this point, this layer can be any of several semiconductor compatible materials such as a Silicon Rich Oxide (SRO) or Multi-Layer Dielectric (MLD) and are not restricted here as long as they also act as a pad layer to relieve stress between the wafer and the nitride hard mask. But for convenience we will continue to call this the oxide pad layer until these different functions are revealed.

The thickness of the pad oxide layer is about 6 Å and is a common thickness needed for the subsequent nitride thickness and is an industry standard step. Then, a silicon nitride layer is deposited on the native oxide layer, which will be used as a hard mask. The thickness of the silicon nitride layer is about 180 nm and is designed to be sufficient to withstand the next processing steps. Industry standard thicknesses are used here. This is similar to a LOCOS process.

In step (c), the silicon nitride layer is patterned using standard lithographic and etching techniques and then partially removed. Next a wet etch is performed to removed the underlying layer, the recipe is adapted for the type of layer present, i.e. where it is the native pad oxide, the SRO or the MLD. This step is done with the photo-resist still on to protect the nitride hard mask. Next the photo-resist is stripped and, the wafer is put into a furnace and oxide is thermally grown in areas that are exposed through the silicon nitride layer, so that a plurality of oxide pillars are formed. Such thermal growth is carried out to 26 nm below the existing silicon nitride layer, and to 30 nm above the silicon nitride layer, so that the thickness of thermal growth becomes about 56 nm. Then, the remaining nitride is stripped In step (d), the wafer is planarized such that the top of the pillars are slightly higher than the pad oxide layer using Chemical-Mechanical Polishing (CMP) to take the wafer to the top of the layer. The depth of the resultant remaining spacer regions becomes about 35 nm.

Next, in step (e), the spacer regions are partially etched so that a plurality of oxide pillars is formed. This is done by using photo-resist and reactive ion etching for $SiO_2$. The height of the oxide pillar is measured in comparison to the height of the surrounding silicon oxide layer and the pillars are etched to allow for fine tuning of the pillar height. The target in this process is to have the top of the pillars to stand approximately 4 nm above the surface of the silicon or the pad oxide layer if it is present (gap d in FIG. 3). In the lower portion of FIG. 2 is shown a perspective view of the structure according to the present embodiment, and also in FIG. 3 a detailed structure is shown to illustrate a sectional view of the embodiment.

Meanwhile, another input wafer, a P-type silicon wafer is prepared (step (f)). The silicon wafer will serve as an anode of the heat diode, and is also a node that will be at a lower temperature. Then, in step (g), the backside of the silicon wafer is stripped and ground, and the front side of the silicon wafer is stripped and wet etched to be in a hydrophobic state. At this time, (step (h)) a native oxide layer formed on the surface of the silicon wafer that is to be bonded to the tops of the plurality of pillars. Note at this point, this layer can be any of several semiconductor compatible processes such a Silicon Rich Oxide (SRO) or Multi-Layer Dielectric (MLD) and are not restricted here. But for convenience we will continue to call this the native oxide layer until these different functions are revealed. Then, the p-type silicon wafer is bonded to the n-type silicon wafer prepared in the previous steps, so that a structure shown in step (i) is finally obtained.

Thermal conductivity is inversely proportional to the length of a conduction path; also the narrower a gap is, the larger the direct tunneling effect. In this embodiment, since the pillars are formed in the pits, it is possible to narrow the gap relative to the length of the thermal conductor (pillar), while increasing the thermal length of the conductor. Also, since the pillars are thermally grown directly from $SiO_2$, the pillars are fixed firmly to the wafer. In this embodiment, the gap d is about 4 Å and the pillars, each having a width of 2 µm×2 µm, are arranged at intervals of 500 µm. In this case, thermal conductivity of 0.578 µW/K is measured. The principal difference between these two approaches is that in this second case the pillars are physically much larger and thus can sustain a larger load. The example is configured to show that a larger structure can also have a low thermal conductivity whilst being large enough to withstand the forces of supporting a vacuum cross the gap between wafers. In the first case, the pillars will collapse under such a force. However, in the first case, such a structure is reasonable in a situation in which the whole structure is within a vacuum chamber. The second case is for when the vacuum is supported across the wafers.

In the resultant structure of this embodiment, the length of the spacer reaches 350 nm, while the length of the spacer in the embodiment illustrated in FIG. 4 is only 1 nm. That is, as a result, thermal resistance will be 350 times that obtained in the embodiment described above with reference to FIG. 4.

One of the key elements of this design is that spacers are used to accurately control the gap, and the spacers are recessed to allow them to have more height and thus have much higher thermal resistance.

With reference to native oxide layers 12, 14, 22 and 24, and the operation of the heat diode, these thermal oxide layers may be removed just prior to bonding the wafers together. It is advantageous to have the native oxide present in some cases and in others to have the oxide layer removed. In some cases material that increases tunneling, changes the work function of the surfaces or also acts as radiation reflectors may replace these layers 12,14,22 and 24. Examples of and material that increases tunneling is SRO (Silicon Rich Oxide), SiON (Silicon Oxy Nitride or a surface treatment to mechanically increase tunneling by roughening. Examples of work function changing materials are tungsten and examples of radiation reflectors are MLD (multilayer dielectric stacks). The radiation reflectors are to prevent the high temperature side of the heat diode from directly radiatively transferring energy to the low temperature side.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for fabricating a thermo-electric semiconductor device, comprising:
   preparing a first electrode layer;
   forming an oxide layer on the first electrode layer;
   forming a mask pattern on the oxide layer;
   thermally growing the oxide layer selectively using the mask pattern to form a plurality of pillars; and
   bonding a second electrode layer to each of tops of the plurality of pillars.

2. The method of claim 1, before the bonding of the second electrode layer, further comprising forming an adhesion layer on a surface of the second electrode layer that is to be bonded to each of the tops of the plurality of pillars.

3. A method for fabricating a thermo-electric semiconductor device, comprising:
   preparing a first electrode layer;
   forming a plurality of spacer regions penetrated into the first electrode layer;
   selectively etching a portion of the spacer regions to form a plurality of pillars; and
   bonding a second electrode layer to each of tops of the plurality of pillars.

4. The method of claim 3, wherein the forming of the plurality of spacer regions comprising:
   forming a spacer layer on the first electrode layer;
   thermally growing the spacer layer selectively into and above the first electrode layer, using a mask pattern; and
   removing the remaining spacer layer except for a portion of the spacer layer grown in the direction of the first electrode layer.

5. The method of claim 3, before the bonding of the second electrode layer, further comprising forming an adhesion layer on a surface of the second electrode layer that is to be bonded to each of the tops of the plurality of pillars.

* * * * *